US009692384B2

(12) United States Patent
Wowro

(10) Patent No.: US 9,692,384 B2
(45) Date of Patent: Jun. 27, 2017

(54) SYSTEM AND METHOD FOR AUDIO VOLUME CONTROL

(71) Applicant: ADVANCED DIGITAL BROADCAST S.A., Geneva (CH)

(72) Inventor: Grzegorz Wowro, Zielona Gora (PL)

(73) Assignee: ADVANCED DIGITAL BROADCAST S.A., Geneva (CH)

( * ) Notice: Subject to any disclaimer, the term of this patent is extended or adjusted under 35 U.S.C. 154(b) by 0 days.

(21) Appl. No.: 15/134,421

(22) Filed: Apr. 21, 2016

(65) Prior Publication Data
US 2016/0322950 A1 Nov. 3, 2016

(30) Foreign Application Priority Data

Apr. 29, 2015 (EP) .................................... 15165555

(51) Int. Cl.
| H03G 3/20 | (2006.01) |
| H03G 7/00 | (2006.01) |
| G06F 3/16 | (2006.01) |
| H03G 3/02 | (2006.01) |
| H03G 3/30 | (2006.01) |
| H03G 3/32 | (2006.01) |
| H04R 5/04 | (2006.01) |
| H04R 3/04 | (2006.01) |
| H04R 29/00 | (2006.01) |
| H04S 7/00 | (2006.01) |

(52) U.S. Cl.
CPC ............. *H03G 7/002* (2013.01); *G06F 3/165* (2013.01); *H03G 3/02* (2013.01); *H03G 3/3026* (2013.01); *H03G 3/32* (2013.01); *H04R 3/04* (2013.01); *H04R 5/04* (2013.01); *H04R 29/004* (2013.01); *H04S 7/00* (2013.01); *H04S 2420/01* (2013.01)

(58) Field of Classification Search
CPC ........................................................ H03G 3/20
See application file for complete search history.

(56) References Cited

U.S. PATENT DOCUMENTS

| 4,611,344 | A | * | 9/1986 | Hayama | ................... | H03G 1/02 |
| | | | | | | 381/108 |
| 9,571,054 | B2 | * | 2/2017 | Dinunzio | ................. | H03G 3/04 |
| 2005/0180585 | A1 | * | 8/2005 | Hsieh | ................... | H03G 1/0088 |
| | | | | | | 381/104 |
| 2007/0206820 | A1 | * | 9/2007 | Ikawa | ................... | H03G 1/0088 |
| | | | | | | 381/104 |
| 2008/0013754 | A1 | * | 1/2008 | Chuo | ...................... | H03G 3/002 |
| | | | | | | 381/104 |
| 2008/0089535 | A1 | * | 4/2008 | Hong | ...................... | H03G 3/002 |
| | | | | | | 381/109 |
| 2008/0240451 | A1 | * | 10/2008 | Takahashi | ................ | H04R 5/02 |
| | | | | | | 381/57 |

(Continued)

Primary Examiner — Olisa Anwah
(74) Attorney, Agent, or Firm — Mark M. Friedman

(57) ABSTRACT

Method for audio volume control, the method comprising the steps of: receiving (301) a volume change request; changing (304) the volume according to a volume change step; the method being characterized in that the volume change step determination (302) is executed by applying one or more rules wherein each rule provides a definition of at least two ranges, with respect to a monitored condition, wherein the volume change step, associated with each such range, is different; storing a new volume change step in a volume step register (120).

9 Claims, 2 Drawing Sheets

(56) References Cited

U.S. PATENT DOCUMENTS

| | | | |
|---|---|---|---|
| 2009/0022338 A1* | 1/2009 | Wong | H03G 3/02 |
| | | | 381/109 |
| 2010/0158259 A1* | 6/2010 | Hanna | H03G 3/3005 |
| | | | 381/28 |
| 2013/0177186 A1* | 7/2013 | Schul | H04R 5/00 |
| | | | 381/300 |
| 2014/0185834 A1* | 7/2014 | Fromel | G06F 3/0488 |
| | | | 381/109 |
| 2016/0379613 A1* | 12/2016 | Liu | H04Q 9/00 |
| | | | 381/57 |

* cited by examiner

SYSTEM AND METHOD FOR AUDIO VOLUME CONTROL

The present invention relates to a system and method for audio volume control. In particular, the present invention relates to a stepwise volume up or volume down control.

Prior art defines systems where a manufacturer of a device sets a volume up/down step and each selection of volume up function increases the volume by a fixed step while each selection of volume down function decreases the volume by a fixed step. Such approach is common in well-known devices such as portable music players, amplifiers, television sets or the like.

Further, prior art volume control systems detect holding of a volume control key and controlling the volume by a number of steps depending on the duration of the key press, for example on a remote control unit.

Other volume control systems, determine a number of steps depending on a magnitude of an angular rotation of a rotatable control such as a volume control knob.

It would be advantageous to control volume adjustments more flexibly instead of using means of a predefined step of for example 2-3 dB.

A drawback of known solutions is that, due to its fixed nature, frequently the volume control step does not meet changing or alternating users' needs as well as changing conditions of audio signal presentation.

The aim of the development of the present invention is an improved system and method for audio volume control.

SUMMARY AND OBJECTS OF THE PRESENT INVENTION

A first object of the present invention is a method for audio volume control, the method comprising the steps of: receiving a volume change request; changing the volume according to a volume change step; wherein the volume change step determination is executed by applying one or more rules; wherein each rule provides a definition of at least two ranges, with respect to a monitored condition, wherein the volume change step, associated with each such range, is different; storing a new volume change step in a volume step register.

Preferably, the one or more rules may be applied separately, or in groups according to a sequence.

Advantageously, the one or more rules associate a volume change step with a current volume obtained from the current volume register.

Preferably, the one or more rules associate a volume change step with a time of day obtained from a timer module.

Advantageously, there is one main rule that sets an absolute volume change step and there are present one or more rules that set a relative volume change step with respect to a previously set absolute volume change step.

Preferably, one or more rules are based on loudness of the input audio signal. The volume of said input audio signal is controlled.

Advantageously, the one or more rules are based on ambient noise loudness.

Preferably, there are separate rules for volume up and separate rules for volume down actions and the volume change step in a volume step register stores a different step value for volume increase and a different step value for volume decrease.

Another object of the present invention is a computer program comprising program code means for performing all the steps of the computer-implemented method according to the present invention when said program is run on a computer.

Another object of the present invention is a computer readable medium storing computer-executable instructions performing all the steps of the computer-implemented method according to the present invention when executed on a computer.

A further object of the present invention is a system for audio volume control, the system comprising: an amplifier of an audio signal; a volume step register; wherein volume up/down actions take into account volume step stored in the volume step register; the system further comprises: the volume step determination module configured to program the volume step register in response to application of at least one volume step determination rule; wherein each rule provides a definition of at least two ranges, with respect to a monitored condition, wherein the volume change step, associated with each such range, is different.

BRIEF DESCRIPTION OF THE DRAWINGS

These and other objects of the invention presented herein, are accomplished by providing a system and method for audio volume control. Further details and features of the present invention, its nature and various advantages will become more apparent from the following detailed description of the preferred embodiments shown in a drawing, in which.

NOTATION AND NOMENCLATURE

Some portions of the detailed description which follows are presented in terms of data processing procedures, steps or other symbolic representations of operations on data bits that can be performed on computer memory. Therefore, a computer executes such logical steps thus requiring physical manipulations of physical quantities.

Usually these quantities take the form of electrical or magnetic signals capable of being stored, transferred, combined, compared, and otherwise manipulated in a computer system. For reasons of common usage, these signals are referred to as bits, packets, messages, values, elements, symbols, characters, terms, numbers, or the like.

Additionally, all of these and similar terms are to be associated with the appropriate physical quantities and are merely convenient labels applied to these quantities. Terms such as "processing" or "creating" or "transferring" or "executing" or "determining" or "detecting" or "obtaining" or "selecting" or "calculating" or "generating" or the like, refer to the action and processes of a computer system that manipulates and transforms data represented as physical (electronic) quantities within the computer's registers and memories into other data similarly represented as physical quantities within the memories or registers or other such information storage.

A computer-readable (storage) medium, such as referred to herein, typically may be non-transitory and/or comprise a non-transitory device. In this context, a non-transitory storage medium may include a device that may be tangible, meaning that the device has a concrete physical form, although the device may change its physical state. Thus, for example, non-transitory refers to a device remaining tangible despite a change in state.

As utilized herein, the term "example" means serving as a non-limiting example, instance, or illustration. As utilized herein, the terms "for example" and "e.g." introduce a list of one or more non-limiting examples, instances, or illustrations.

DESCRIPTION OF EMBODIMENTS

Figure 1:
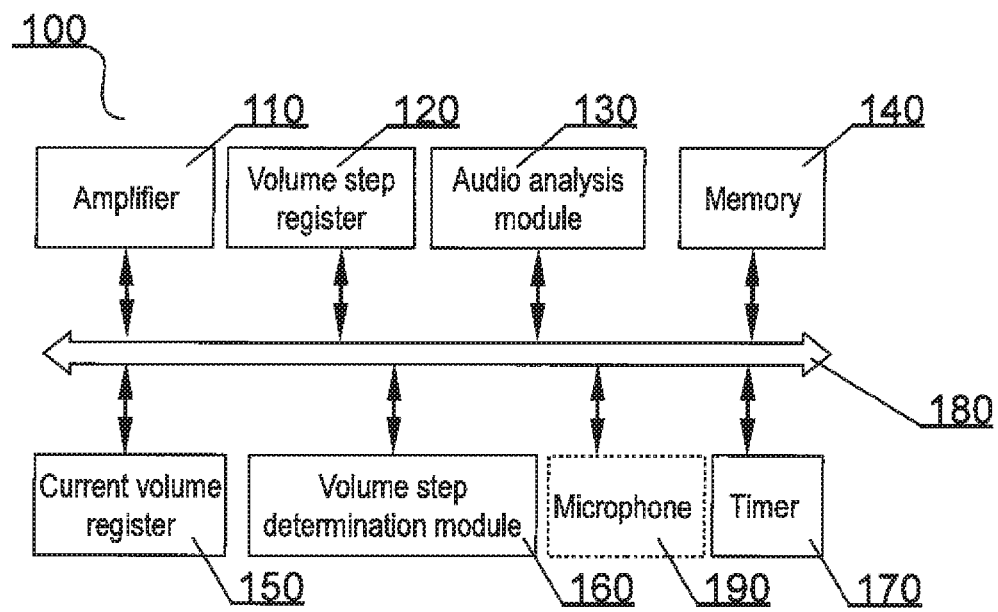
FIG. 1 presents a diagram of the system according to the present invention.

FIG. 1 presents a diagram of the system (100) according to the present invention. An amplifier (110) is controlled by means of volume up/down lines (not shown) the state of which invokes volume up/down actions respectively. These volume up/down lines are appropriately driven by first and second user input means that allow the user to change the output volume in an upward or downward direction. Such first and second user input means might be buttons of a remote control unit of an audio outputting device.

The amplifier (110) comprises a regular audio signal input, on which it operates as will be evident to a person skilled in the art.

The volume up/down actions take into account volume up/down step stored in a volume step register (120). This register may store a different step value (e.g. in decibels) for volume increase and a different step value for volume decrease. This is due to a fact, that user's tend to prefer a smaller step in case of volume increase and a larger step in case of volume decrease.

The amplifier (110) may also report current volume or normalized current volume (e.g. in a scale 0 to 100) to a current volume register (150). This information is applicable in embodiments of the present invention, where current volume is a parameter of a rule for determining volume change step.

Similarly, the present system (100) may comprise a programmable timer module (170), which may store time as well as date. This information is applicable in embodiments of the present invention, where current time/date is a parameter of a rule for determining volume change step.

A further module of the present invention is a volume step determination module (160). This module is responsible for programming the volume step register (120) in response to the application of at least one volume step determination rule. Such rules will be elaborated on with reference to FIG. 2.

Such rules may include analysis of current time and/or data, analysis of current volume level, analysis of currently played audio. In case of the latter, the system (100) comprises an audio analysis module (130) configured to analyze current loudness of the processes audio signal subject to amplification by the amplifier (110). Loudness is the characteristic of a sound that is primarily a psychological correlate of physical strength (amplitude). More formally, it is defined as "that attribute of auditory sensation in terms of which sounds can be ordered on a scale extending from quiet to loud" (source: Wikipedia).

Further, the system (100) may comprise a microphone module (190), which may record ambient sound level. This information is applicable in embodiments of the present invention, where current ambient sound level is a parameter of a rule for determining volume change step.

The system (100) may be realized using dedicated components or custom made FPGA or ASIC circuits. The system comprises a data bus (180) communicatively coupled to other components of the system, including the memory (140). Additionally, other components of the system are communicatively coupled to the system bus (180) so that they may be managed by the volume step determination module (160).

Figure 2:
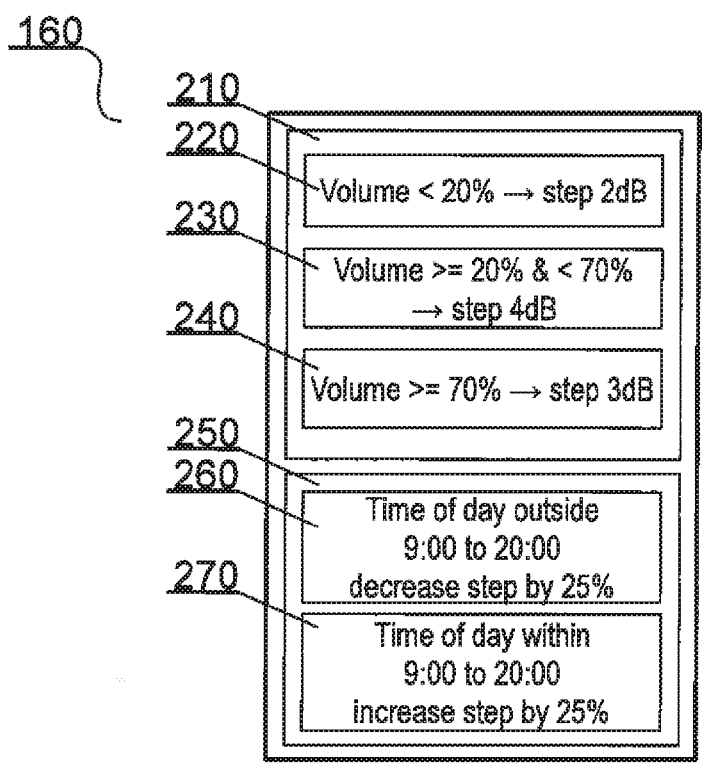
FIG. 2 shows an example of a database of rules.

FIG. 2 shows an example of a database of rules. The database may be stored in the memory (140) or in the volume step determination module (160).

In this example, two rules (210, 250) are present that may be applied separately. However, more rules may be applied together or groups of rules may be applied as selected by a user via a suitable graphical user interface (GUI) as will be evident to a person skilled in the art of graphical user interfaces. Such GUI may allow for defining a sequence of rules, wherein selected rules are successively applied in a given order.

Rule (210) is a rule that associates a volume change step with a current volume obtained from the current volume register (150). In this example, three ranges of volume (220, 230 and 240) are given. However, there may be more of fewer ranges defined.

Preferably, the ranges are defined such that they do not overlap. For example, if current volume is in a range lower than 20% of the maximum volume, the step of volume change is set to 2 dB, if current volume is in a range equal or greater than 20% and below 70% of the maximum volume, the step of volume change is set to 4 dB whereas if current volume is in a range equal or greater than 70% of the maximum volume, the step of volume change is set to 3 dB.

Rule (250) is a rule that associates a volume change step with a time of day obtained from the timer module (170). In this example, two ranges of time (260, 270) are given. However, there may be more of fewer ranges defined.

Preferably the ranges are defined such that they do not overlap. For example, if the current time of day is in a range outside of 9:00 to 20:00, the currently determined volume change step (e.g. determined by the rule (210)) may be decreased by 25%, while if current time of day is in a range within of 9:00 to 20:00, the currently determined volume change step (e.g. determined by the rule (210)) may be increased by 25%.

In this manner both, the rule (210) and the rule (250) may be applied for the determination of a volume change step.

It is also favorable that there is one main rule, in this case rule (210) that sets an absolute volume change step (e.g. 3 dB), while there may be present other rules, such as rule (250), that set a relative volume change step (e.g. +20%) with respect to a previously set absolute volume change step.

Another example of a rule is based on input from the microphone (190). For example, if ambient noise loudness is below 60 dB, the volume change level may be set to +20%, while if the ambient noise loudness is above 60 dB the volume change level may be set to +5%.

Another example of a rule is based on loudness of the input audio signal currently amplified by the amplifier (110). For example, if loudness of the input audio is below 60 dB the volume change level may be set to +25%, while if the loudness is above 60 dB the volume change level may be set to +0%.

In another embodiment, there may be separate rules for volume up and separate rules for volume down actions.

Thus, in general it may be defined that different rules, wherein each rule provides a definition of at least two ranges, with respect to a monitored condition (typically a signal), wherein the volume change step, associated with each such range, is different.

Figure 3:
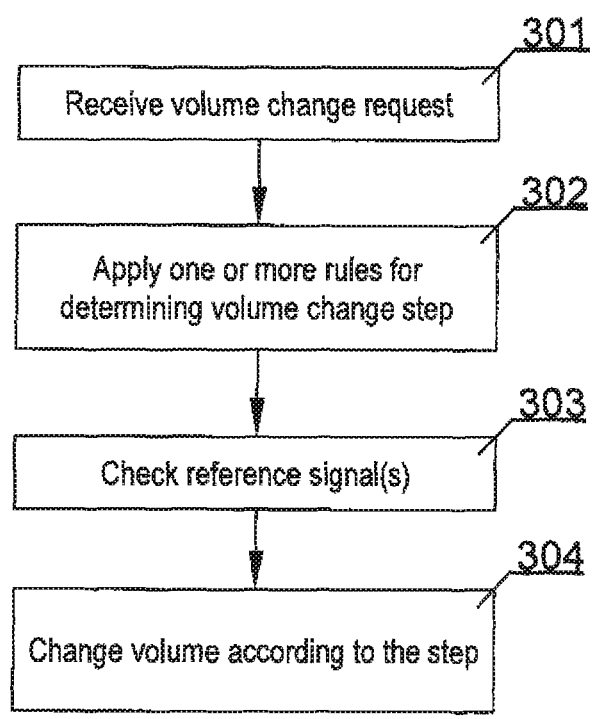
FIG. 3 depicts a method according to the present invention.

FIG. 3 depicts a method according to the present invention. The process starts at step (301) from receiving a volume change request. Next, at step (302) there is executed a step of applying one or more rules for determining volume change step. Subsequently, at step (303) one or more input signals on which the selected rules depend are checked. For example state of the timer, current volume level etc. In response, a new volume change step may be stored in the volume step register (120). Finally, at step (304) the volume is changed according to the volume change step.

The present invention simplifies volume control and adapts it to the users' needs. Therefore, the invention provides a useful, concrete and tangible result.

The invention has been presented with respect to a device comprising an amplifier (110) and volume control means controlled by a suitable controller (160) as presented herein. Thus the machine or transformation test is fulfilled and the idea is not abstract.

It can easily be recognized by one skilled in the art, that the aforementioned method for audio volume control may be performed and/or controlled by one or more computer programs. Such computer programs are typically executed by utilizing the computing resources in a computing device. Applications are stored on a non-transitory medium. An example of a non-transitory medium is a non-volatile memory, for example a flash memory while an example of a volatile memory is RAM. The computer instructions are executed by a processor. These memories are for example recording media for storing computer programs comprising computer-executable instructions performing all the steps of the computer-implemented method according the technical concept presented herein.

While the invention presented herein has been depicted, described, and has been defined with reference to particular preferred embodiments, such references and examples of implementation in the foregoing specification do not imply any limitation on the invention. It will, however, be evident that various modifications and changes may be made thereto without departing from the broader scope of the technical concept. The presented preferred embodiments are exemplary only, and are not exhaustive to the scope of the technical concept presented herein.

Accordingly, the scope of protection is not limited to the preferred embodiments described in the specification, but is only limited by the claims that follow.

The invention claimed is:

1. A method for audio volume control, the method comprising the steps of:
    receiving a volume change request;
    changing the volume according to a volume change step, wherein determination of the volume change step is executed by applying one or more rules, wherein each rule provides a definition of at least two ranges, with respect to a monitored condition, wherein the volume change step, associated with each such range, is different; and
    storing a new volume change step in a volume step register,
    wherein there are separate rules for volume up and separate rules for volume down actions and that the volume change step in a volume step register stores a different step value for volume increase and a different step value for volume decrease.

2. The method according to claim 1, wherein the one or more rules may be applied separately, or in groups according to a sequence.

3. The method according to claim 1, wherein the one or more rules associate a volume change step with a current volume obtained from the current volume register.

4. The method according to claim 1, wherein the one or more rules associate a volume change step with a time of day obtained from a timer module.

5. The method according to claim 1, wherein there is one main rule that sets an absolute volume change step and that one or more rules are further present, said one or more rules set a relative volume change step with respect to a previously set absolute volume change step.

6. The method according to claim 1, wherein the one or more rules are based on loudness of an input audio signal, and that the volume of said input audio signal is controlled.

7. The method according to claim 1, wherein the one or more rules are based on ambient noise loudness.

8. A non-transitory computer readable medium storing computer-executable instructions performing all the steps of the computer-implemented method according to claim 1 when executed on a computer.

9. A system for audio volume control, the system comprising:
    an amplifier of an audio signal;
    a volume step register, wherein volume up and volume down actions take into account a volume step stored in the volume step register; and
    a volume step determination module configured to program the volume step register in response to application of at least one volume step determination rule, wherein each rule provides a definition of at least two ranges, with respect to a monitored condition, wherein the volume change step, associated with each such range, is different, and wherein there are separate rules for volume up and separate rules for volume down actions and that the volume change step in a volume step register stores a different step value for volume increase and a different step value for volume decrease.

* * * * *